United States Patent
Cho et al.

(10) Patent No.: US 8,105,950 B2
(45) Date of Patent: Jan. 31, 2012

(54) METHOD FOR FORMING FINE PATTERNS USING ETCHING SLOPE OF HARD MASK LAYER IN SEMICONDUCTOR DEVICE

(75) Inventors: Sung-Yoon Cho, Kyoungki-do (KR); Hye-Ran Kang, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1085 days.

(21) Appl. No.: 12/001,127

(22) Filed: Dec. 10, 2007

(65) Prior Publication Data
US 2008/0230516 A1 Sep. 25, 2008

(30) Foreign Application Priority Data
Mar. 19, 2007 (KR) .................. 10-2007-0026515

(51) Int. Cl.
*H01L 21/311* (2006.01)
(52) U.S. Cl. ........ 438/696; 438/701; 438/717; 438/736; 216/47
(58) Field of Classification Search ............... 438/696, 438/701, 717, 736; 216/47
See application file for complete search history.

(56) References Cited

U.S. PATENT DOCUMENTS

| | | | |
|---|---|---|---|
| 6,080,681 A * | 6/2000 | Tabara | 438/734 |
| 6,448,179 B2 * | 9/2002 | Kim et al. | 438/672 |
| 2004/0048203 A1 * | 3/2004 | Furusawa et al. | 430/314 |
| 2006/0003588 A1 * | 1/2006 | Lindsay et al. | 438/694 |
| 2006/0046201 A1 * | 3/2006 | Sandhu et al. | 430/314 |
| 2006/0076677 A1 * | 4/2006 | Daubenspeck et al. | 257/734 |
| 2007/0020565 A1 | 1/2007 | Koh et al. | |
| 2007/0037309 A1 * | 2/2007 | Nakamura et al. | 438/48 |
| 2007/0048662 A1 * | 3/2007 | Park et al. | 430/270.1 |
| 2007/0059934 A1 * | 3/2007 | Park et al. | 438/689 |
| 2007/0111467 A1 * | 5/2007 | Kim | 438/424 |
| 2007/0178663 A1 * | 8/2007 | Kim | 438/424 |
| 2008/0057724 A1 * | 3/2008 | Kiehlbauch et al. | 438/706 |

FOREIGN PATENT DOCUMENTS

| | | |
|---|---|---|
| CN | 99803212 | 4/2001 |
| CN | 200610080920 | 12/2006 |
| KR | 10-2005-0035363 | 4/2005 |
| KR | 10-2005-0073363 | 7/2005 |

* cited by examiner

*Primary Examiner* — Binh X Tran
(74) *Attorney, Agent, or Firm* — Blakely, Sokoloff, Taylor & Zafman (57) ABSTRACT

A method for forming fine patterns in a semiconductor device includes forming a first hard mask layer and a second hard mask layer over an etch target layer, forming second hard mask patterns by etching the second hard mask layer, wherein an etching profile of the second hard mask layer has a positive slope, and etching the first hard mask layer and the etch target layer using the second hard mask patterns as an etch mask.

14 Claims, 7 Drawing Sheets

PRIOR ART

PRIOR ART

METHOD FOR FORMING FINE PATTERNS USING ETCHING SLOPE OF HARD MASK LAYER IN SEMICONDUCTOR DEVICE

CROSS-REFERENCE TO RELATED APPLICATIONS

The present invention claims priority of Korean patent application number 2007-0026515, filed on Mar. 19, 2007, which is incorporated by reference in its entirety.

BACKGROUND OF THE INVENTION

The present invention relates to a method for fabricating a semiconductor device and, more particularly, to a method for forming fine patterns in a semiconductor device.

Generally, with the increase in integration of a semiconductor device, the miniaturization of patterns is essentially required; however, there is a limit to the pattern miniaturization in the semiconductor device because current photolithography apparatus is also limited to a restricted light wavelength.

In order to solve the above-mentioned problem, a double patterning process which forms the fine patterns using two sheets of the photo masks has been proposed recently. The double patterning process makes it possible to form the fine patterns beyond the limit to the photolithography apparatus. Referring to FIG. 1A to 1D, the double patterning process will be described below.

FIGS. 1A to 1D are cross-sectional views of a method for forming fine patterns in a typical semiconductor device.

Figure 1A:
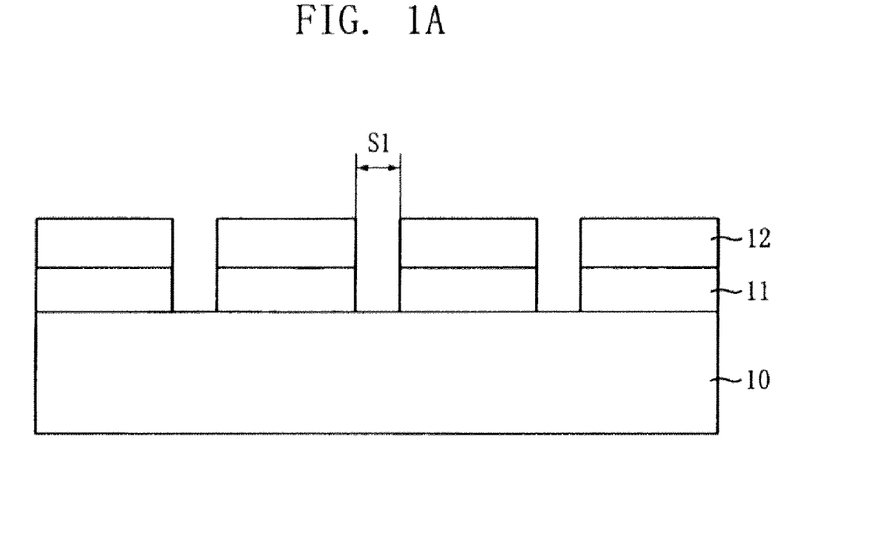
FIGS. 1A to 1D are cross-sectional views of a method for forming fine patterns in a typical semiconductor device.

Referring to FIG. 1A, after a hard mask layer 11 is formed over an etch target layer 10, the hard mask layer 11 is coated with a first photoresist layer. The first photoresist layer is patterned by exposing and developing processes and then photoresist patterns 12 are formed. The photoresist patterns 12 have a space width S1. Next, the hard mask layer 11 is etched using the first photoresist patterns 12 as an etch mask.

Figure 1B:
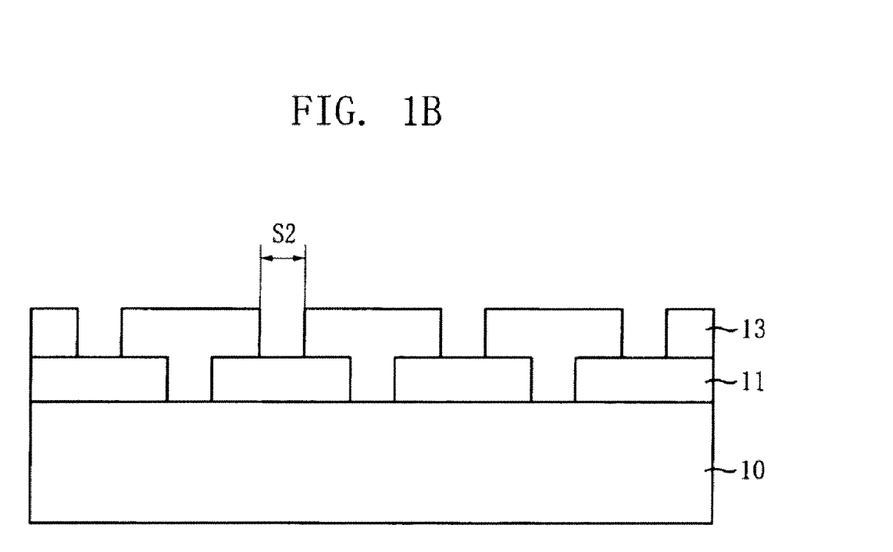

Referring to FIG. 1B, after removing the first photoresist patterns 12, a second photoresist layer is deposited on the resultant structure and exposing and developing processes are applied to the second photoresist layer to form the second photoresist patterns 13. The second photoresist patterns 13 have a space width S2. The openings of the second photoresist patterns 13 are formed in such a manner that they do not overlap with the openings of the first photoresist patterns 12.

Figure 1C:
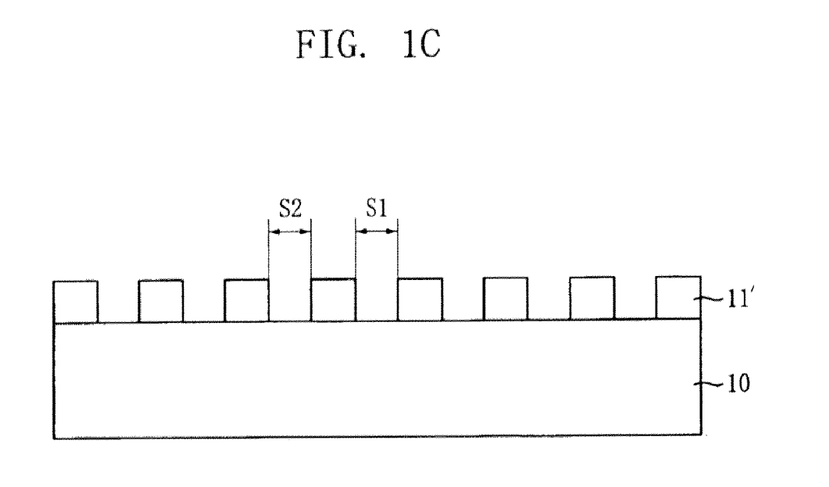

Referring to FIG. 1C, the hard mask layer 11 is etched using the second photoresist patterns 13 as an etch mask, thereby forming hard mask patterns 11'. Since the hard mask patterns 11' are formed by two etching processes, the line and space widths of the hard mask patterns 11' are reduced.

Figure 1D:
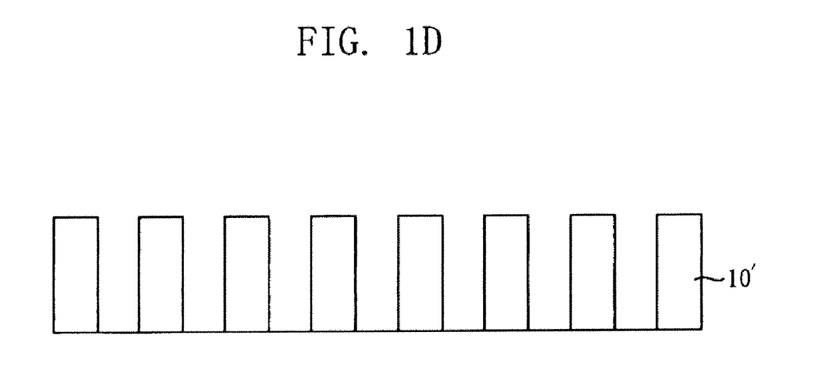

Referring to FIG. 1D, the etch target layer 10 is etched using the hard mask patterns 11' as an etch mask so that etch target patterns 10' are formed. At this time, the etch target patterns 10' have the line and space widths which are correspondent to the line and space widths of the hard mask patterns 11'.

However, even if this double patterning process is applied to the pattern formation, it is still difficult to form the micro patterns of less than 20 nm. The reason for the difficulties of the pattern formation is as follows.

In the pattern formation using the double patterning process, the most importance is to reduce the space widths (S1 and S2 in FIGS. 1A and 1B) between the first and the second photoresist patterns which are used as the etch masks. However, it is difficult to form the space widths of less than 20 nm because of the limit of the current photolithography apparatus. If the space widths between the photoresist patterns are formed in a range of below 20 nm, the failure to the device may be caused by the bridges and bad patterns. Therefore, it is very difficult to form the fine patterns of less than 20 nm through the photoresist patterns which have the space widths of less than 20 nm.

Further, in case a lower layer is etched using a general photoresist pattern, the wider the space widths formed in the lower layer is, the higher the aspect ratio of the lower layer is. Therefore, it is difficult to form the micro patterns in case the aspect ratio of the lower layer (the hard mask layer and/or the etch target layer) under the photoresist pattern is higher.

Accordingly, the technology capable of forming the fine patterns is needed in a state where the space widths of the photoresist patterns are wide and the aspect ratio of the lower layer is high.

SUMMARY OF THE INVENTION

Embodiments of the present invention are directed to providing a method for forming fine patterns in a semiconductor device by providing a positive slope for a lateral profile of a hard mask layer at the time of patterning a hard mask layer even if space widths of photoresist patterns are wide and an aspect ratio of a lower layer under the photoresist patterns is high.

In accordance with an aspect of the present invention, there is a provided a method for forming fine patterns in a semiconductor device. The method includes forming a first hard mask layer and a second hard mask layer over an etch target layer, forming second hard mask patterns by etching the second hard mask layer, wherein an etching profile of the second hard mask layer has a positive slope, and etching the first hard mask layer and the etch target layer using the second hard mask patterns as an etch mask.

DESCRIPTION OF SPECIFIC EMBODIMENTS

FIGS. 2A to 2J are cross-sectional views of a method for forming fine patterns in accordance with an embodiment of the present invention.

Figure 2A:
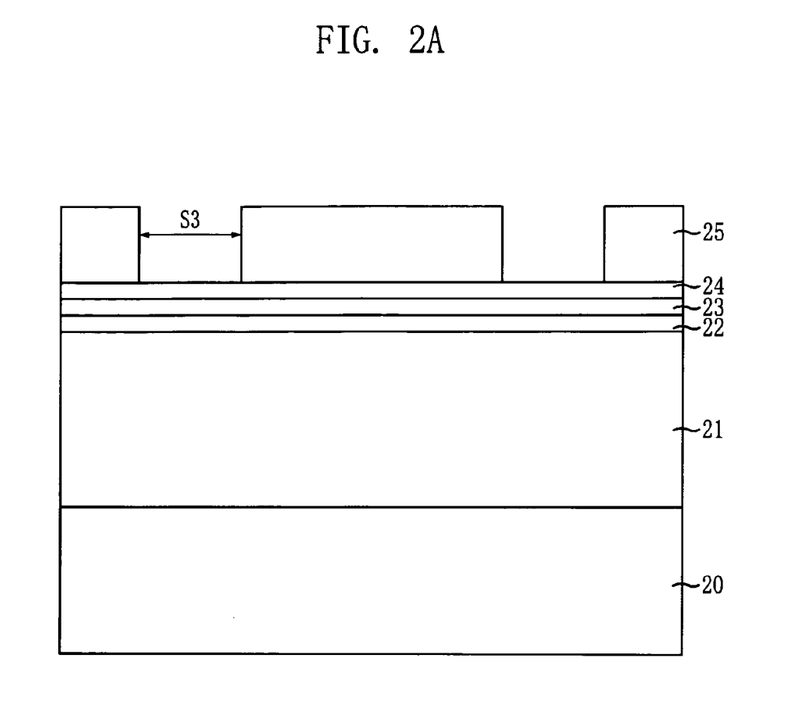
FIGS. 2A to 2J are cross-sectional views of a method for forming fine patterns in accordance with an embodiment of the present invention.

Referring to FIG. 2A, a hard mask layer, which has a stacked structure of an amorphous carbon layer 21, a silicon oxy-nitride (SiON) layer 22 and an aluminum oxide ($Al_2O_3$) layer 23, is formed. An etch target layer 20 and a first anti-reflection layer 24 are formed over the $Al_2O_3$ layer 23. At this time, etch target layer 20 can be made of a nitride layer.

Subsequently, a first photoresist layer is deposited on the first anti-reflection layer 24 and the first photoresist layer is patterned through exposing and developing processes in order to form photoresist patterns 25. Preferably, the first photoresist layer is of negative tone. In FIG. 2A, S3 denotes a space width between the photoresist patterns 25.

Figure 2B:
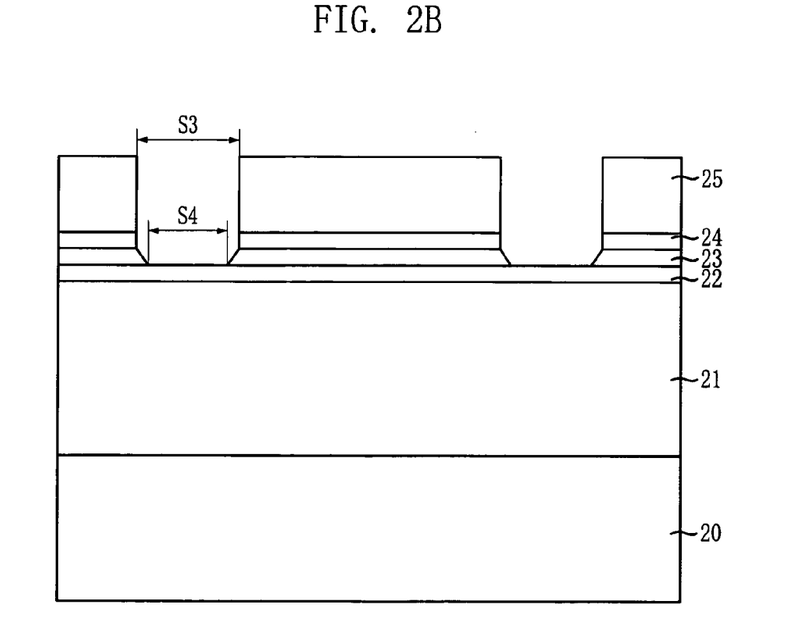

Referring to FIG. 2B, the first anti-reflection layer 24 is etched using the first photoresist patterns 25 as an etch mask. At this time, the etching process of the first anti-reflection layer 24 can be performed by using one selected from $N_2/O_2$, $N_2/H_2$, $Cl_2/O_2$ and $CF_4/O_2$ and a gas mixture thereof.

Next, the $Al_2O_3$ layer 23 is etched using the first photoresist patterns 25 as an etch mask. At this time, the etching process of the $Al_2O_3$ layer 23 is performed in such a manner that the $Al_2O_3$ layer 23 has a positive slope in its lateral profile. Accordingly, a space width S4 between the patterned $Al_2O_3$ layers 23 is narrower than the space width S3 between the photoresist patterns 25.

The etching process of the $Al_2O_3$ layer 23 can be performed based on a $BCl_3$ gas. Moreover, the slope of the lateral profile of the $Al_2O_3$ layer 23 is controlled by a temperature of a wafer chuck. That is, the slope of the lateral profile is perpendicularly formed when the temperature of the wafer chuck is high and formed with a relatively large value in a positive direction when the temperature of the wafer chuck is low. Accordingly, it is possible to control the slope of the lateral profile of the $Al_2O_3$ layer 23 by controlling the temperature of the wafer chuck according to the space width S3 between the first photoresist patterns 25. Accordingly, it is possible to control the space width S4 between the patterned $Al_2O_3$ layers 23 by controlling the slope of the lateral profile of the $Al_2O_3$ layer 23.

Figure 2C:
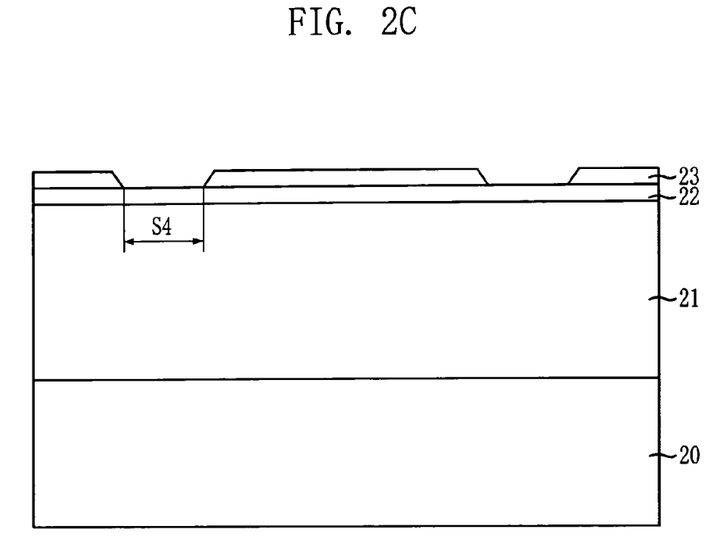

Referring to FIG. 2C, after removing the first photoresist patterns 25 and the first anti-reflection layer 24, a post cleaning process is performed. At this time, the removal of the first photoresist patterns 25 can be performed by a removal process using $O_2$ plasma.

Figure 2D:
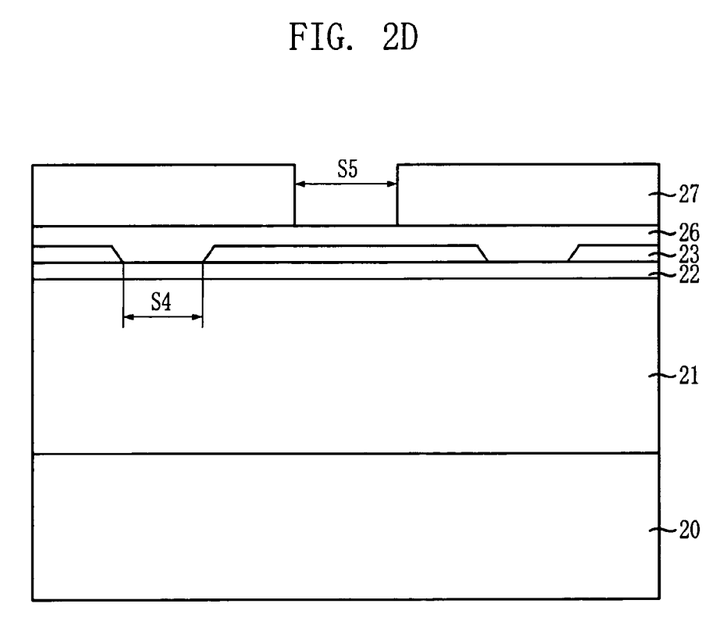

Referring to FIG. 2D, a second anti-reflection layer 26 is formed over the resulting structure. A second photoresist layer is deposited on the second anti-reflection layer 26 and second photoresist patterns 27 are formed through exposing and developing processes. In the preferred embodiment of the present invention, the second photoresist layer is of negative tone. The distance between the second photoresist patterns 27 is denoted as a space width S5. Openings of the second photoresist patterns 27 are not overlapped with the openings of the $Al_2O_3$ layer 23. Preferably, the openings of the second photoresist patterns 27 are disposed to divide each pattern of the $Al_2O_3$ layer 23 into two sections.

Figure 2E:
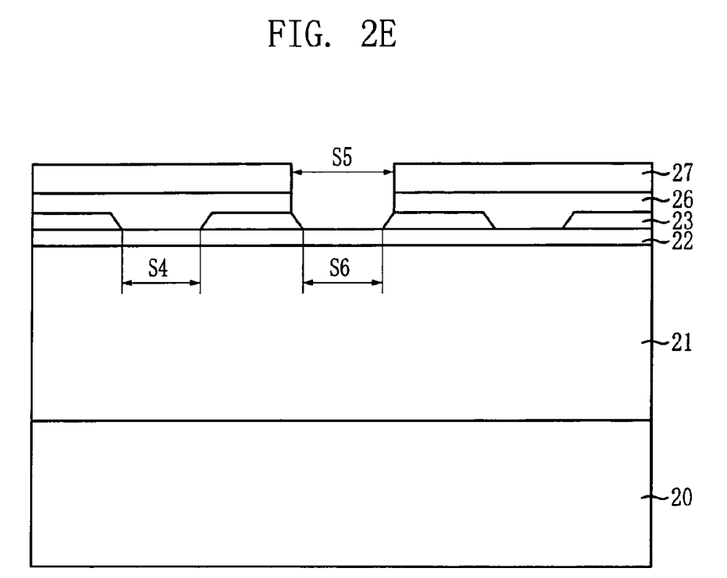

Referring to FIG. 2E, the second anti-reflection layer 26 is etched using the second photoresist patterns 27 as an etch mask. At this time, the etching process of the second anti-reflection layer 26 can be performed by using one selected from $N_2/O_2$, $N_2/H_2$, $Cl_2/O_2$ and $CF_4/O_2$ gases or a gas mixture thereof.

Subsequently, the $Al_2O_3$ layer 23 is etched again using the second photoresist patterns 27 as an etch mask. The etching condition of the $Al_2O_3$ layer 23 is identical with that described in FIG. 2B. That is, the etching process of the $Al_2O_3$ layer 23 is performed in order that the lateral profile has a positive slope. As a result, a space width S6 of the $Al_2O_3$ layer 23 is narrower than the space width S5 of the second photoresist patterns 27. Moreover, while the etching process of the $Al_2O_3$ layer 23 is carried out through a $BCl_3$ gas, the lateral slope is controlled by the temperature of the wafer chuck. This secondary etching process is carried out by the same conditions which are applied to the first etching process in FIG. 2B.

Figure 2F:
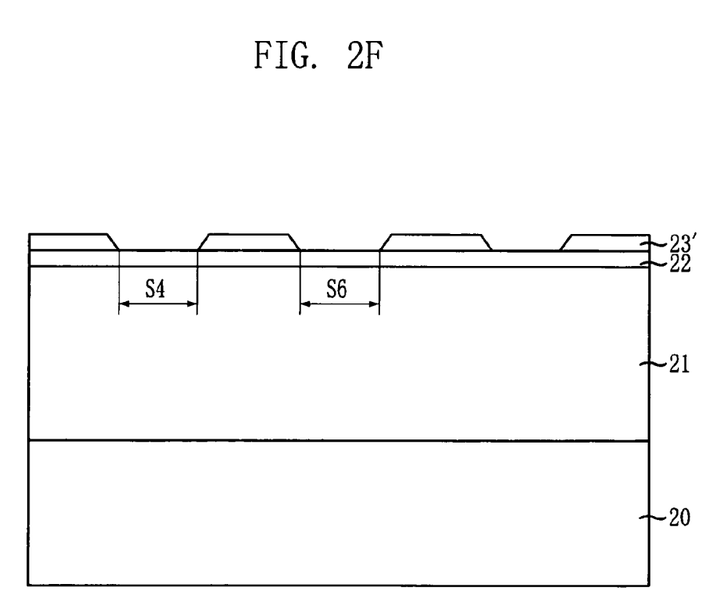

Referring to FIG. 2F, after removing the second photoresist patterns 27 and the second anti-reflection layer 26, a post cleaning process is performed. Also, the removal of the second photoresist patterns 27 can be performed by a removal process using $O_2$ plasma.

Consequently, $Al_2O_3$ patterns 23' are formed by these two etching processes. The $Al_2O_3$ patterns 23' have the space widths S4 and S6 which are narrower than the space widths S3 and S4 of the first and the second photoresist patterns 25 and 27. Therefore, in case that a lower layer (the SiON layer 22), the amorphous carbon layer 21 and the etch target layer 20 is etched in the subsequent processes, the fine patterns with the narrower space width are produced.

That is, since the space widths themselves between the photoresist patterns cannot be reduced by the double patterning technique used in the typical photolithography technology, the method for reducing the space widths between the hard mask patterns (especially, the $Al_2O_3$ patterns 23') is used.

However, in case this method for reducing the space widths is not sufficient for the fine patterns, an additional process can be further employed and this additional process will be described in detail referring to FIG. 2G.

Figure 2G:
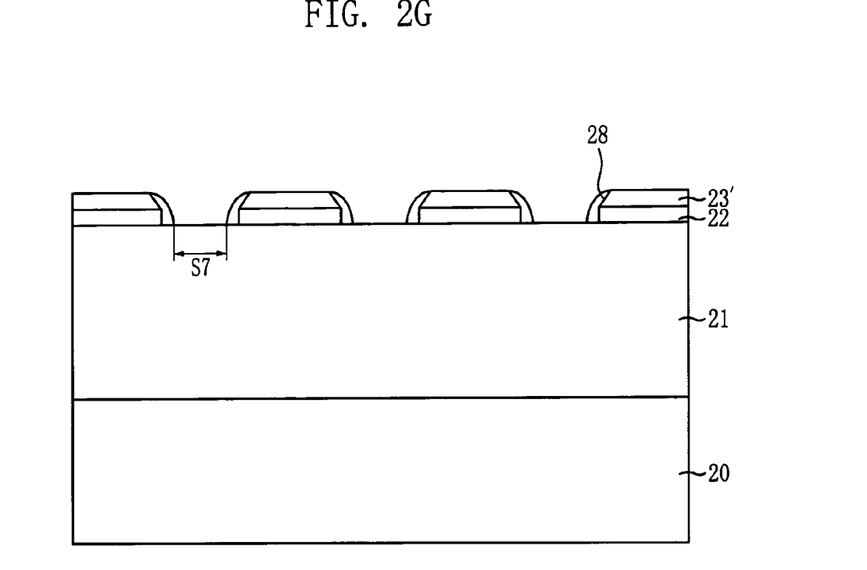

Referring to FIG. 2G, polymer layers 28 are formed on the sidewalls of the $Al_2O_3$ patterns 23' and the SiON layer 22 while the SiON layer 22 is etched using the $Al_2O_3$ patterns 23' as an etch mask. These polymer layers 28 are formed by etching the SiON layer 22 using a CF-based gas. Fluorine radical of the CF-based gas combine with the $Al_2O_3$ atoms of the $Al_2O_3$ patterns 23' and $AlF_3$ polymer is then generated. Since the nonvolatile characteristic of the $AlF_3$ polymer is high, the $AlF_3$ polymer is easily deposited on the sidewalls of the $Al_2O_3$ patterns 23' and the SiON layer 22.

After forming the polymer layers 28, the space widths are much narrower than the space widths S4 and S6 between the $Al_2O_3$ patterns 23'. The generation of the $AlF_3$ polymer can be controlled by controlling a flow rate of the CF-based gas and the ratio of fluorine (F) to carbon (C) and the space widths S7 are also controlled by such a generation of the $AlF_3$ polymer.

Figure 2H:
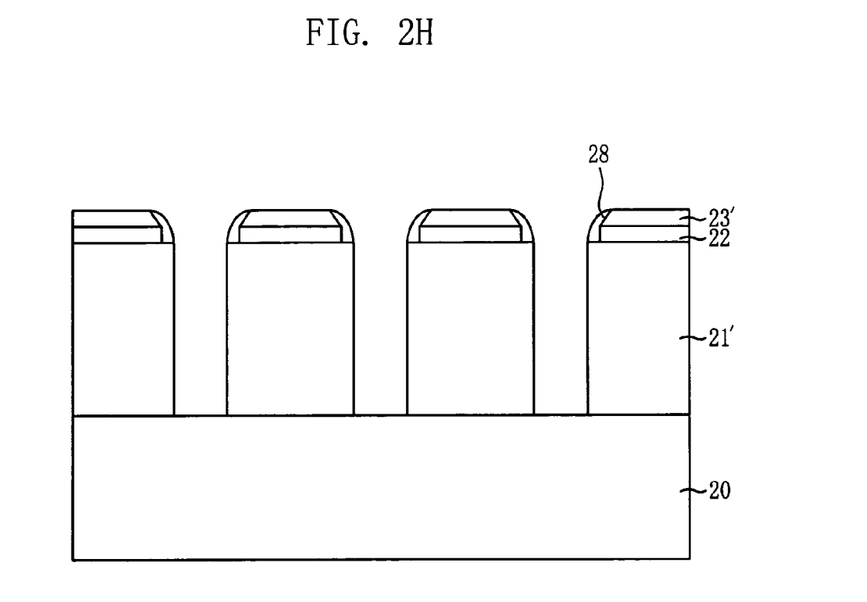

Referring to FIG. 2H, the amorphous carbon layer 21 is etched using the $Al_2O_3$ patterns 23' (the $Al_2O_3$ patterns 23' and the polymer layers 28 in case the additional process in FIG. 2G is added) as an etch mask. The amorphous carbon patterns 21' are formed with the narrower space widths which are correspondent to the space widths S4 and S6 between the $Al_2O_3$ patterns 23' (or correspondent to the space widths S7 in case the additional process in FIG. 2G is added). Although the $Al_2O_3$ patterns 23' and the polymer layers 28 can be lost when the amorphous carbon layer 21 is etched, the narrower space width S7 is still available.

Figure 2I:
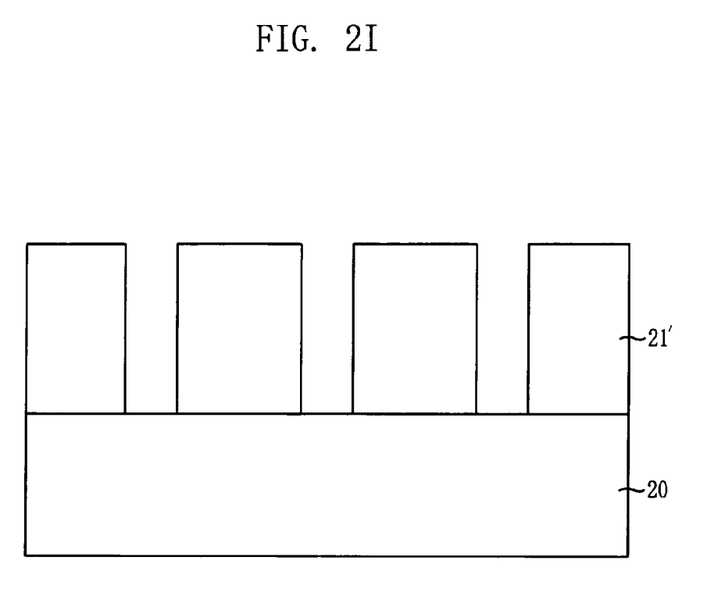
Figure 2J:
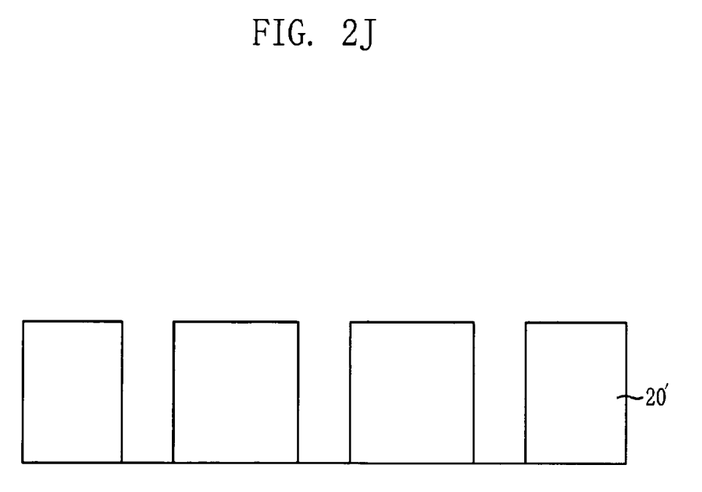

Referring to FIGS. 2I and 2J, after forming patterns 20' with the narrow space widths by etching the etch target layer 20 using the amorphous carbon patterns 21' as an etch mask, the amorphous carbon patterns 21' are removed. The space widths between the patterns 20' can be reduced, for example, less, than 20 nm and this reduction can be also achieved in the case that the aspect ratio of the etch target layer 20 is high.

As apparent from the above, the present invention can form the fine patterns in a semiconductor device by providing the positive slope for the lateral profile of the hard mask layer at the time of patterning the hard mask layer even if the space widths of photoresist patterns are wide and an aspect ratio of a lower layer under the photoresist patterns is high.

While the present invention has been described with respect to the particular embodiments, it will be apparent to those skilled in the art that various changes and modifications may be made without departing from the spirit and scope of the invention as defined in the following claims.

What is claimed is:

1. A method for forming fine patterns in a semiconductor device, the method comprising:

forming a first hard mask layer and a second hard mask layer over an etch target layer;

forming a first anti-reflection layer over the second hard mask layer;

forming first mask patterns over the first anti-reflection layer;

first etching the first anti-reflection layer and the second hard mask layer using the first mask patterns as an etch mask, wherein the etching profile of the second hard mask layer has a positive slope;

removing the first mask patterns and the first anti-reflection layer;

forming a second anti-reflection layer over the resultant structure where the first mask patterns and the first anti-reflection layer are remove;

forming second mask patterns over the second anti-reflection layer, wherein openings of the second mask patterns are not overlapped with openings of the first mask patterns;

second etching the second anti-reflection layer and the first etched second hard mask layer using the second mask patterns as an etch mask, wherein the etching profile of the second hard mask layer has positive slope;

removing the second mask patterns and the second anti-reflection layer; and etching the first hard mask layer and the etch target layer using the second etched second hard mask layer as an etch mask.

2. The method of claim wherein the second hard mask layer is an $Al_2O_3$, layer, wherein the first hard mask layer is a SiON layer, and wherein the first hard mask layer is etched by CF-based gas.

3. The method of claim 1, herein the first and the second mask patterns are of negative tone.

4. The method of claim 1, wherein removing the first or second mask patterns are carried out using $O_2$ plasma.

5. The method of claim 1, wherein the first and the second anti-reflection layers are etched by one selected from $N_2/O_2$, $N_2/H_2$, $Cl_2/O_2$ and $CF_4/O_2$ and a gas mixture thereof.

6. The method of claim 1, wherein the openings of the second mask patterns are disposed to divide each pattern between the openings of the first mask patterns into two sections.

7. The method of claim 1, wherein polymer layers are formed on sidewalls of both the second etched second hard mask layer and the first hard mask layer while the first hard mask layer is etched and wherein the etch target layer is patterned by the second etched second hard mask layer and the polymer layers.

8. The method of claim 7, wherein the polymer layers are $AlF_3$ polymer layers.

9. The method of claim 1, wherein a third hard mask layer is provided between the first hard mask layer and the etch target layer and wherein the third hard mask layer is made of a signal layer or a multi-layers.

10. The method of claim 9, wherein the third mask layer is al amorphous carbon layer.

11. The method of claim 1, wherein the second hard mask layer is an aluminum oxide ($Al_2O_3$) layer.

12. The method of claim 11 herein the second hard mask layer is etched by $BCl_3$ gas.

13. The method of claim 11, wherein the etching profile of the second hard mask layer is controlled by a temperature of a wafer chuck.

14. The method of claim 13, wherein the etching profile of the second hard mask layer has an increasing positive slope with a decreasing of the temperature of the wafer chuck.

* * * * *